United States Patent
Li et al.

(10) Patent No.: US 12,046,893 B2
(45) Date of Patent: Jul. 23, 2024

(54) LEAKAGE CURRENT DETECTION AND INTERRUPTION DEVICE FOR POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 273 days.

(21) Appl. No.: 17/840,233

(22) Filed: Jun. 14, 2022

(65) Prior Publication Data

US 2023/0402833 A1    Dec. 14, 2023

(30) Foreign Application Priority Data

Jun. 8, 2022   (CN) .......................... 202210644150.0
Jun. 8, 2022   (CN) .......................... 202221421860.9

(51) Int. Cl.
*H02H 3/16*   (2006.01)
*G01R 31/52*  (2020.01)

(52) U.S. Cl.
CPC .............. *H02H 3/16* (2013.01); *G01R 31/52* (2020.01)

(58) Field of Classification Search
CPC ........ G01R 31/52; G01R 31/58; H02H 3/044; H02H 3/16; H02H 3/335
USPC ......................................................... 361/42
See application file for complete search history.

(56) References Cited

U.S. PATENT DOCUMENTS

| | | |
|---|---|---|
| 4,707,759 A | 11/1987 | Bodkin |
| 5,708,364 A | 1/1998 | Vokey et al. |
| 6,697,238 B2 | 2/2004 | Bonilla et al. |
| 8,605,402 B2 | 12/2013 | Ward et al. |
| 8,853,539 B2 | 10/2014 | Ye et al. |
| 9,312,680 B2 | 4/2016 | Li et al. |
| 9,331,582 B2 | 5/2016 | Goerke |
| 9,356,402 B2 | 5/2016 | Sung et al. |
| 9,535,106 B2 | 1/2017 | Li |
| 9,547,047 B2 | 1/2017 | Li et al. |
| 9,564,119 B2 | 2/2017 | Ryu et al. |
| 9,697,926 B2 | 7/2017 | Huang et al. |

(Continued)

FOREIGN PATENT DOCUMENTS

WO     2010011321 A1    1/2010

*Primary Examiner* — Kevin J Comber
(74) *Attorney, Agent, or Firm* — Chen Yoshimura LLP

(57) ABSTRACT

A leakage current detection and interruption device for power cord includes a switch module, a leakage current detection module, an open circuit detection module, and a trigger module. The switch module controls the electrical connection between input and output ends of the power cord. The leakage current detection module has two leakage current detection lines to collect leakage current on the power supply lines of the power cord. The open circuit detection module is coupled to the leakage current detection module, and generates an open-circuit fault signal when an open circuit exists in at least one of the two leakage current detection lines. The trigger module is coupled to the switch module and the open circuit detection module, and receives a leakage fault signal and/or the open-circuit fault signal, and in response thereto, drives the switch module to disconnect the electrical connection between the input and output ends.

20 Claims, 7 Drawing Sheets

(56) References Cited

U.S. PATENT DOCUMENTS

| | | |
|---|---|---|
| 10,840,698 B2 | 11/2020 | Li et al. |
| 10,886,724 B2 | 1/2021 | Li et al. |
| 11,281,070 B2 | 3/2022 | Sun et al. |
| 11,381,070 B1 | 7/2022 | Legatti |
| 11,600,984 B1 | 3/2023 | Li et al. |
| 2006/0119997 A1 | 6/2006 | Lee |
| 2006/0146456 A1 | 7/2006 | Williams |
| 2006/0198067 A1 | 9/2006 | Pearse |
| 2007/0159740 A1 | 7/2007 | Williams et al. |
| 2008/0007878 A1 | 1/2008 | Gandolfi et al. |
| 2008/0062593 A1 | 3/2008 | Li et al. |
| 2008/0099227 A1 | 5/2008 | Zhang et al. |
| 2010/0020452 A1 | 1/2010 | Gandolfi |
| 2010/0046128 A1 | 2/2010 | Wang et al. |
| 2011/0061892 A1 | 3/2011 | Ye et al. |
| 2011/0273813 A1 | 11/2011 | Huang |
| 2012/0119918 A1 | 5/2012 | Williams |
| 2012/0249151 A1 | 10/2012 | Dobusch et al. |
| 2014/0117995 A1 | 5/2014 | Topucharla |
| 2015/0009592 A1 | 1/2015 | Aromin et al. |
| 2015/0309105 A1 | 10/2015 | Ostrovsky et al. |
| 2015/0349517 A1 | 12/2015 | Li et al. |
| 2016/0111869 A1 | 4/2016 | Li et al. |
| 2017/0222425 A1 | 8/2017 | Li et al. |
| 2018/0292466 A1 | 10/2018 | Hackl et al. |
| 2019/0089074 A1 | 3/2019 | Oms |
| 2019/0097412 A1 | 3/2019 | Li et al. |
| 2019/0115748 A1 | 4/2019 | Li et al. |
| 2020/0091707 A1 | 3/2020 | Li et al. |
| 2020/0366083 A1 | 11/2020 | Li et al. |
| 2020/0393520 A1* | 12/2020 | Li .................. G01R 31/58 |
| 2021/0006060 A1 | 1/2021 | Li et al. |
| 2021/0027915 A1 | 1/2021 | Aromin et al. |
| 2021/0125746 A1 | 4/2021 | Aromin et al. |
| 2021/0125753 A1 | 4/2021 | Aromin et al. |
| 2021/0125754 A1 | 4/2021 | Aromin et al. |
| 2021/0239770 A1 | 8/2021 | Li et al. |
| 2022/0011378 A1 | 1/2022 | Li et al. |
| 2024/0063631 A1* | 2/2024 | Zou .................. H02H 5/10 |

* cited by examiner

LEAKAGE CURRENT DETECTION AND INTERRUPTION DEVICE FOR POWER CORD AND RELATED ELECTRICAL CONNECTORS AND ELECTRICAL APPLIANCES

BACKGROUND OF THE INVENTION

Field of the Invention

This invention relates to electrical circuits, and in particular, it relates to a leakage current detection and interruption (LCDI) device for a power cord, and related electrical connectors and electrical appliances.

Description of Related Art

Leakage current detection and interruption (LCDI) device is a fire hazard prevention device for electrical appliances. Its is implemented in a power cord with a plug, and functions to detect any leakage current between the hot and neutral power supply lines and their shield layers along the power cord from the plug to the electrical load (e.g., air conditioner, dehumidifier, etc.). When a leakage current is detected, the LCDI device can disconnect the electrical power from the power source to the appliance, preventing fire hazard and ensuring safety. Thus, LCDI devices can prevent fire hazard caused by arc fault due to physical damage and lost of insulation in the power cord, which may be caused by aging of the hot, neutral and ground wires, wear, pinching, animal chewing, etc.

The leakage current detection technique in conventional LCDI devices typically requires a pre-set detection voltage on the leakage current detection lines. This technique can provide protection when there is a leakage current condition on a power supply line (e.g., neutral line, hot line), but when the detection line for detecting the leakage current has an open circuit condition, the LCDI device cannot detect the leakage current, and the device still connects the output end to the input end; moreover, the device cannot detect the open circuit fault in itself. This is a great safety threat.

SUMMARY

Accordingly, in a first aspect, the present invention provides a leakage current detection and interruption device for a power cord, which includes: a first power supply line and a second power supply line; a switch module, configured to control an electrical connection of the first power supply line and second power supply line between an input end and an output end; a leakage current detection module, including a first leakage current detection line and a second leakage current detection line, which respectively cover the first and second power supply lines and are configured to respectively detect leakage currents on the first and second power supply lines; an open circuit detection module, coupled to the leakage current detection module, and configured to generate an open-circuit fault signal in response to detecting an open circuit condition in at least one of the first and second leakage current detection lines; and a trigger module, coupled to the switch module and the open circuit detection module, configured to receive the open-circuit fault signal, and in response thereto, to drive the switch module to disconnect the electrical connection between the input and output ends.

In some embodiments, the open circuit detection module includes a zero-sequence current transformer, coupled to the first and second leakage current detection lines and the trigger module, wherein in response to an open circuit condition in at least one of the first and second leakage current detection lines, the zero-sequence current transformer generates the open-circuit fault signal and applies it to the trigger module.

In some embodiments, the open circuit detection module includes a photocoupler, coupled to the first and second leakage current detection lines and the trigger module, wherein in response to an open circuit condition in at least one of the first and second leakage current detection lines, the photocoupler generates the open-circuit fault signal and applies it to the trigger module.

In some embodiments, the trigger module includes: a solenoid, configured to generate an electromagnetic force in response to a current flowing therethrough to drive the switch module; and at least one semiconductor device, coupled in series with the solenoid, and coupled to the open circuit detection module, configured to cause a current to flow through the solenoid in response to the open-circuit fault signal.

In some embodiments, the trigger module further includes: a half-bridge rectifier, coupled to the solenoid, the semiconductor device and the open circuit detection module, configured to provide a rectified drive current to the solenoid; or a full-bridge rectifier, coupled to the solenoid, the semiconductor device and the open circuit detection module, configured to provide a rectified drive current to the solenoid.

In some embodiments, the leakage current detection module is configured to generate a leakage fault signal in response detecting the leakage current on the first and/or second power supply line, wherein the open circuit detection module is further configured to receive the leakage fault signal and to generate a trigger signal in response thereto, and wherein the trigger module is further configured to receive the trigger signal, and in response thereto, to drive the switch module to disconnect the electrical connection between the input and output ends.

In some embodiments, the leakage current detection and interruption device further includes a test module, which includes a test switch coupled to at least one of the first and second leakage current detection lines; wherein in response to the test switch being closed and the leakage current detection module having no fault condition, the trigger module is further configured to drive the switch module to disconnect the electrical connection between the input and output ends.

In some embodiments, the semiconductor device is selected from a group consisting of: a silicon trolled rectifier, a bipolar transistor, a field-effect transistor, and a photocoupler.

In another aspect, the present invention provides a leakage current detection and interruption device for a power cord, which includes: a first power supply line and a second power supply line; a switch module, configured to control an electrical connection of the first power supply line and second power supply line between an input end and an output end; a leakage current detection module, including a first leakage current detection line and a second leakage current detection line, which respectively cover the first and second power supply lines and are configured to respectively detect leakage currents on the first and second power supply lines; an open circuit detection module, including a zero-sequence current transformer coupled to the leakage current detection module, the open circuit detection module being configured to generate an open-circuit fault signal in response to detecting an open circuit condition in at least one of the first and second leakage current detection lines; and a trigger module, coupled to the switch module and an output of the open circuit detection module, configured to receive the open-circuit fault signal, and in response thereto, to drive the switch module to disconnect the electrical connection between the input and output ends.

In another aspect, the present invention provides a leakage current detection and interruption device for a power cord, which includes: a first power supply line and a second power supply line; a switch module, configured to control an electrical connection of the first power supply line and second power supply line between an input end and an output end; a leakage current detection module, including a first leakage current detection line and a second leakage current detection line, which respectively cover the first and second power supply lines and are configured to respectively detect leakage currents on the first and second power supply lines; an open circuit detection module, including a photocoupler coupled to the leakage current detection module, the open circuit detection module being configured to generate an open-circuit fault signal in response to detecting an open circuit condition in at least one of the first and second leakage current detection lines; and a trigger module, coupled to the switch module and an output of the open circuit detection module, configured to receive the open-circuit fault signal, and in response thereto, to drive the switch module to disconnect the electrical connection between the input and output ends.

In another aspect, the present invention provides an electrical power connection device, which includes: a body; and a leakage current detection and interruption device according to any one of the above embodiments, disposed inside the body.

In another aspect, the present invention provides an electrical appliance, which includes: an electrical load; and an electrical power connection device coupled between a power supply and the electrical load, configured to supply power to the electrical load, wherein the electrical power connection device includes a leakage current detection and interruption device according to any one of the above embodiments.

In the LCDI device according to various embodiments of the present invention, the two leakage current detection lines respectively cover a power supply line, and form a leakage current detection path along with the open circuit detection module, the trigger module and the switch module; it can detect the leakage current on each leakage current detection line and detect an open circuit condition on each leakage current detection line, thereby providing a more reliable LCDI device and enhancing safety for the user. The LCDI device according to embodiments of the present invention has a simple circuit structure, is low cost and reliable.

BRIEF DESCRIPTION OF THE DRAWINGS

Preferred embodiments of the present invention are described with reference to the drawings. These drawings serve to explain the embodiments and their operating principle, and only illustrate structures that are necessary to the understanding of the principles of the invention. These drawings are not necessarily to scale. In the drawings, like features are designated by like reference symbols.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

A main technical problem solved by embodiments of the present invention is the operation stability of the LCDI device.

To solve the problem, embodiments of the present invention provides an LCDI device, which includes: a switch module, a leakage current detection module, an open circuit detection module, and a trigger module. The switch module controls the electrical connection between the input end and the output end of the LCDI device. The leakage current detection module includes a first leakage current detection line covering the first power supply line, which collects a leakage current on the first power supply line, and a second leakage current detection line covering the second power supply line, which collects a leakage current on the second power supply line. The open circuit detection module is coupled to the leakage current detection module, and is configured to generate an open-circuit fault signal in response to an open circuit condition in at least one of the first leakage current detection line and the second leakage current detection line. The trigger module is coupled to the switch module and the open circuit detection module, and is configured to receive a leakage fault signal and/or the open-circuit fault signal, and in response thereto, to drive the switch module to disconnect the electrical connection between the input end and the output end.

Figure 1:
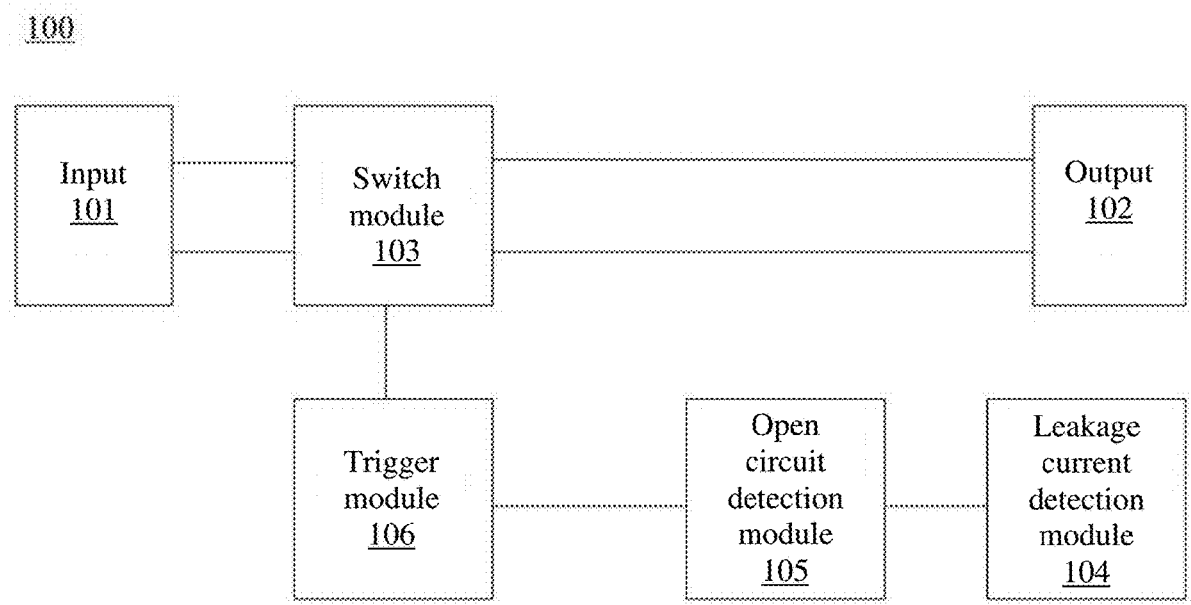
FIG. 1 is a block diagram of an LCDI device according to embodiments of the present invention.

FIG. 1 is a block diagram of an LCDI device according to embodiments of the present invention. As shown in FIG. 1, the LCDI device for power cord 100 includes a switch module 103, a leakage current detection module 104, an open circuit detection module 105, and a trigger module 106. The switch module 103 controls the electrical connection between the input end 101 and output end 102. The leakage current detection module 104 includes a first leakage current detection line and a second leakage current detection line. The first leakage current detection line covers the first power supply line of the power cord, and detects a first leakage current on the first power supply line. The second leakage current detection line covers the second power supply line of the power cord, and detects a second leakage current on the second power supply line. The leakage current detection module 104 generates a leakage fault signal when the first and/or second leakage current is detected. The open circuit detection module 105 is coupled to the leakage current detection module 104 and the trigger module 106; it is configured to generate an open circuit fault signal when at least one of the first and second leakage current detection lines has an open circuit condition, and also configured to receive the leakage fault signal. The trigger module 106 is coupled to the open circuit detection module 105 and the switch module 103, and controls the switch module 103 to disconnect the power to the output end as a result of the detection of the first and/or second leakage current or the open circuit. In other words, the open circuit detection module 105 controls the trigger module 106 with a trigger signal (e.g. a trigger signal generated in response to the leakage fault signal, or the open circuit fault signal which constitutes a trigger signal), to cause the trigger module 106 to drive the switch module 103 to disconnect the power at the output end. To put it another way, when the first leakage current detection line detects the first leakage current and/or the second leakage current detection line detects the second leakage current, or when the open circuit detection module 105 detects an open circuit condition, the open circuit detection module 105 causes the trigger module 106 to drive the switch module 103 to disconnect the power. In the LCDI device 100, the two leakage current detection lines respectively cover two power supply lines and form a leakage current detection path with the open circuit detection module 105 and the trigger module 106. Thus, the LCDI device 100 can detect the leakage currents on the two power supply lines, and detect the open circuit conditions on the two leakage current detection lines.

In some embodiments, the open circuit detection module 105 detects whether a current path formed partly by at least one of the leakage current detection lines is an open circuit. When it receive no current signal in at least one of the current paths, it generates an open circuit fault signal, which triggers the trigger module to drive the switch module to disconnect power from the input end to the output end.

More specifically, when the leakage current detection lines do not have any open circuit conditions, the open circuit detection module 105 outputs a low voltage, and when the leakage current detection lines have an open circuit conditions, the open circuit detection module 105 outputs a high voltage.

In some embodiments, the open circuit detection module 105 includes at least an zero-sequence current transformer ZCT or a photocoupler U1, coupled to the two leakage current detection lines. When at least one of the first and second leakage current detection lines has an open circuit, the zero-sequence current transformer ZCT or the photocoupler U1 generates the open circuit fault signal and feeds it to the trigger module.

In some embodiments, the trigger module 106 includes a solenoid and at least one semiconductor device. The solenoid generates an electromagnetic force to drive the switch module 103. The semiconductor device is coupled to the solenoid and the open circuit detection module 105, and causes the solenoid to generate the electromagnetic force in response to a trigger signal (e.g. a trigger signal caused by a leakage current, or the open circuit fault signal) from the open circuit detection module 105. The semiconductor device may be a silicon trolled rectifier, a bipolar transistor, a field-effect transistor, a photocoupler, etc.

In some embodiment, the trigger module 106 includes a half-bridge rectifier or a full-bridge rectifier, coupled to the solenoid, the semiconductor device and the open circuit detection module, configured to provide a rectified drive current to the solenoid.

In some embodiments, the LCDI device 100 further includes a test module (not shown in FIG. 1). The test module includes a test switch coupled to the leakage current detection module 104. When the test switch is closed and the leakage current detection module 104 is functioning normally, the trigger module 106 drives the switch module 103 to disconnect power to the output end. When the test switch is closed but the leakage current detection module 104 has a fault, the switch module 103 maintains power supply to the output end. By using the test module, the device enables the use to manually test whether the current detection module 104 (the first and second leakage current detection lines) has a fault (e.g., open circuit). When there is a fault, the power supply to the output end is maintained when the test switch is pressed, which acts as a warning to the user. This enhances the reliability of the LCDI device 100.

In an alternative embodiment (not shown in FIG. 1), an output signal (leakage fault signal) of the leakage current detection module 104 which indicates a leakage fault is directly coupled to the trigger module 106, and the trigger module 106 drives the switch module 103 to disconnect power to the output end in response to the leakage fault signal.

Figure 2:
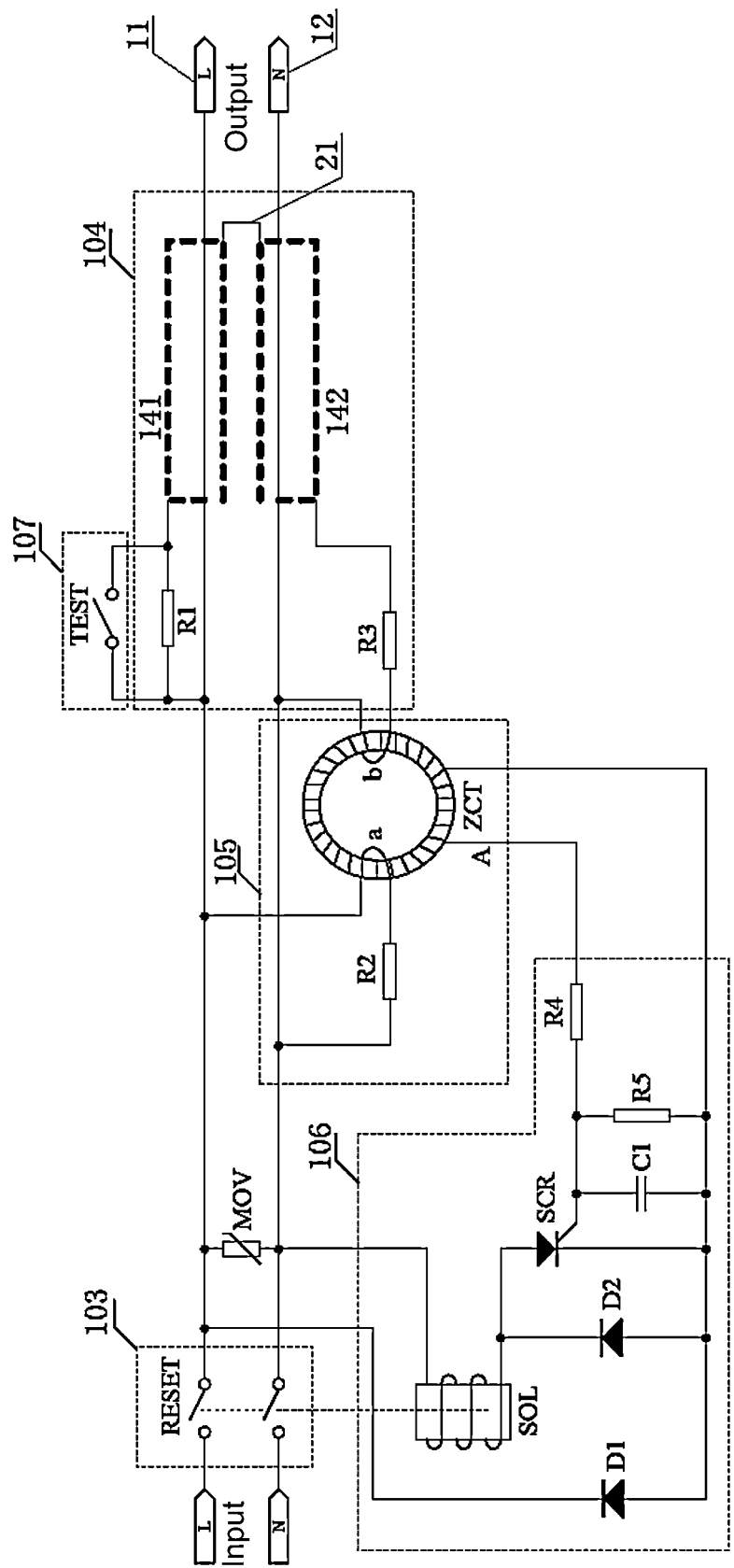
FIG. 2 is a circuit diagram of an LCDI device according to a first embodiment of the present invention.

FIG. 2 is a circuit diagram of a power cord with an LCDI device according to a first embodiment of the present invention. As shown in FIG. 2, the LCDI device includes a switch module 103, a leakage current detection module 104, an open circuit detection module 105, a trigger module 106, and a test module 107. The switch module 103 include a reset switch RESET, configured to control the electrical connection and disconnection between the input end and output end. The power cord includes a first power supply line 11 (L, hot line) and second power supply line 12 (N, neutral line). The leakage current detection module 104 includes at least a first leakage current detection line 141 and a second leakage current detection line 142, respectively covering the first power supply line 11 and second power supply line 12. In this embodiment, the first ends of the first power supply line 11 and second power supply line 12 are the ends farther away from the output end (the load), i.e. the left end in FIG. 2; their second ends are the ends closer to the output end, i.e. the right end in FIG. 2.

As shown in FIG. 2, the first end of the first leakage current detection line 141 is coupled via resistor R1 to the first power supply line 11, and its second end is coupled by a conductor 21 to the second end of the second leakage current detection line 142, so that the two leakage current detection lines are coupled in series. The first end of the second leakage current detection line 142 is coupled via resistor R3, and after passing through a zero-sequence current transformer ZCT (at a section referred to as the loop-threading line b), to the second power supply line 12. Another loop-threading line a also passes through the ZCT, and is coupled to the first power supply line 11 at one end, and to the second power supply line 12 via resistor R12 at the other end.

In the open circuit detection module 105, the first output end A of the ZCT is coupled via resistor R4 to the control electrode of a silicon trolled rectifier SCR. The second output end of the ZCT is coupled via diode D1 to the first power supply line 11, and also coupled via diode D2 to one end of the solenoid SOL. In the trigger module 106, a capacitor C1 is coupled between the control electrode and cathode of the SCR. The cathode of the SCR is also coupled to the anodes of diodes D1 and D2 and to the second output end of the ZCT. The anode of the SCR is coupled to the cathode of diode D2 and the one end of the solenoid SOL. The other end of the solenoid SOL is coupled to the second power supply line 12. The solenoid SOL is mechanically coupled to the reset switch RESET. The cathode of diode D1 is coupled to the first power supply line 11.

When both the first leakage current detection line 141 and the second leakage current detection line 142 are working normally (no open-circuit condition), a current flows from the first power supply line 11 to the second power supply line 12 through a first current path formed by R1-141-21-142-R3-b, and also through a second current path formed by a-R2. By setting the resistance of resistors R1, R2 and R3 so that the vector sum of the currents on the loop threading lines a and b that pass through the ZCT is below a predetermined threshold current, the voltage at the first output end A of the ZCT is below a predetermined threshold voltage, so that it cannot trigger the SCR via resistor R4. When the SCR is not triggered (i.e. not conductive), the switch module 103 remains in the connected state.

When the first power supply line 11 causes a leakage current on the first leakage current detection line 141 (first leakage current) or the second power supply line 12 causes a leakage current on the second leakage current detection line 142 (second leakage current), the current that flows through the loop threading line b changes (which constitutes a leakage fault signal), so that the vector sum of the current that pass through the ZCT increases to above the threshold current. As a result, the voltage at the first output A of the ZCT rises to above the threshold voltage (which constitutes a trigger signal), triggering the SCR via resistor R4 (i.e. the SCR becomes conductive). Thus, a current flows through the solenoid SOL, so the solenoid SOL drives the switch module 103 to disconnect power to the output end.

When the first leakage current detection line 141 or the second leakage current detection line 142 has an open circuit condition, the current that flows through the loop threading line b changes, so that the vector sum of the current that pass through the ZCT increases to above the threshold current. As a result, the voltage at the first output A of the ZCT rises to above the threshold voltage (which constitutes an open-circuit fault signal, another example of a trigger signal), triggering the SCR via resistor R4. Thus, a current flows through the solenoid SOL, so the solenoid SOL drives the switch module 103 to disconnect power to the output end.

Further, in this embodiment, the test module 107 may be used to perform fault testing for the LCDI device. When all components of the LCDI device are working normally and there is no leakage current between the first leakage current detection line 141 and the first power supply line 11 or between the second leakage current detection line 142 and the second power supply line 12, if the test switch TEST is manually closed, the first output end A of the ZCT of the open circuit detection module 105 is above the threshold voltage, triggering the SCR via resistor R4. Thus, a current flows through the solenoid SOL, so the solenoid SOL drives the switch module 103 to disconnect power to the output end.

If any component in the LCDI device is faulty, a test current path cannot be properly formed when the test switch TEST is closed; as a result, the SCR cannot be triggered and cannot cause the reset switch RESET to disconnect the power to the output end. This indicates to the user that the LCDI device is faulty and should not be used. Thus, the user may operate the test switch TEST to test the LCDI device.

Figure 3:
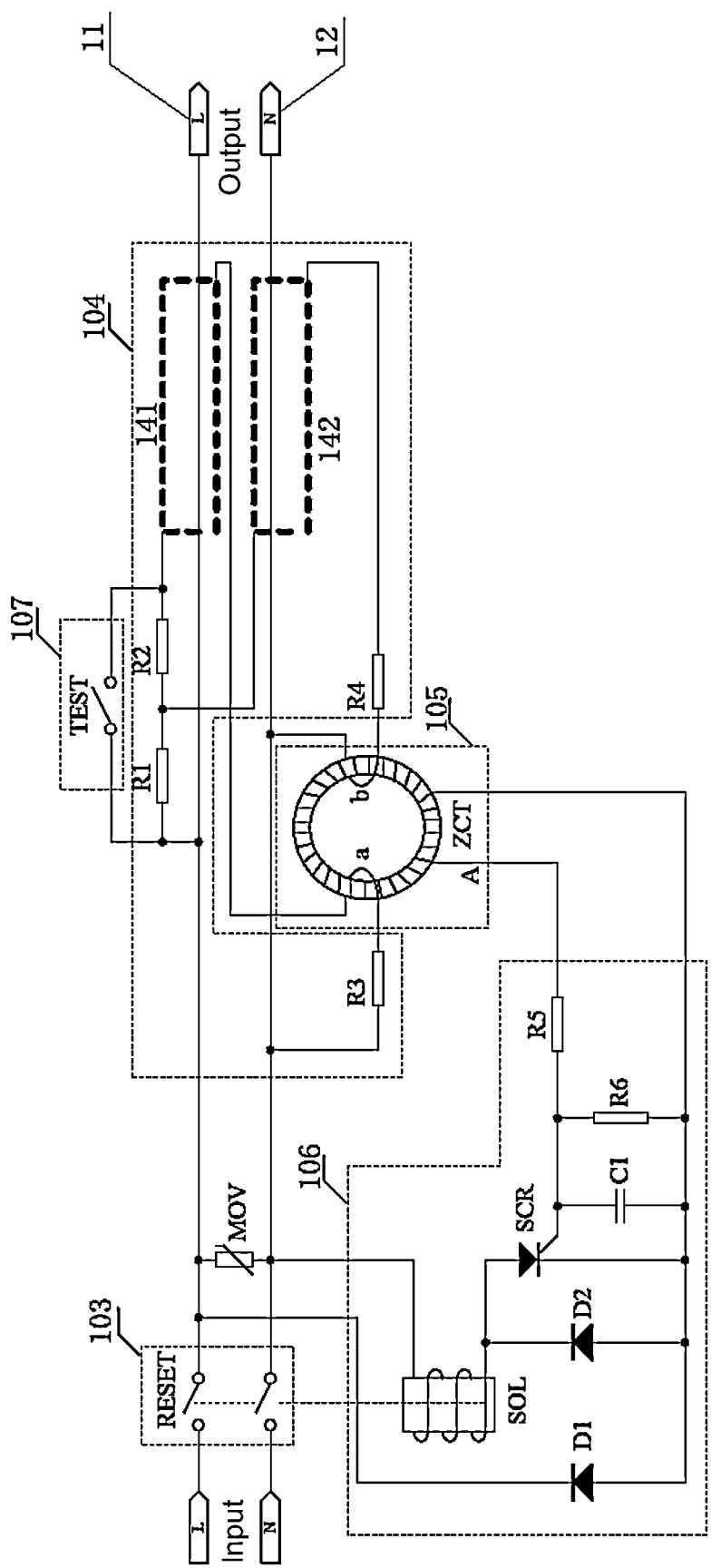
FIG. 3 is a circuit diagram of an LCDI device according to a second embodiment of the present invention.

FIG. 3 is a circuit diagram of an LCDI device according to a second embodiment of the present invention. Compared to the embodiment of FIG. 2, a main difference is that, while in FIG. 2 the first leakage current detection line 141 and second leakage current detection line 142 are coupled in series, in FIG. 3, the first leakage current detection line 141 and second leakage current detection line 142 are coupled in a parallel configuration to perform leakage current detection.

When the LCDI device is working normally, a current flows from the first power supply line 11 to the second power supply line 12 through a first current path formed by R1-R2-141-a-R3, and also through a second current path formed by R1-142-R4-b. By setting the resistance of resistors R1, R2, R3 and R4 so that the vector sum of the currents on the loop threading lines a and b that pass through the ZCT is below a predetermined threshold current, the voltage at the first output end A of the ZCT is below a predetermined threshold voltage, so that it cannot trigger the SCR via resistor R5. As a result, the switch module 103 remains in the connected state.

When the first power supply line 11 or the second power supply line 12 has a leakage, a leakage current is present on the first leakage current detection line 141 or the second leakage current detection line 142. Accordingly, the current that flows through the loop threading line a or b changes (which constitutes a leakage fault signal), so that the vector sum of the current that pass through the ZCT increases to above the threshold current. As a result, the voltage at the first output A of the ZCT rises to above the threshold voltage (which constitutes a trigger signal), triggering the SCR via resistor R5. Thus, a current flows through the solenoid SOL, so the solenoid SOL drives the switch module 103 to disconnect power to the output end.

When the first leakage current detection line 141 or the second leakage current detection line 142 has an open circuit condition, the current that flows through the loop threading line a or b changes, so that the vector sum of the current that pass through the ZCT increases to above the threshold current. As a result, the voltage at the first output A of the ZCT rises to above the threshold voltage (which constitutes an open-circuit fault signal, another example of a trigger signal), triggering the SCR via resistor R5. Thus, a current flows through the solenoid SOL, so the solenoid SOL drives the switch module 103 to disconnect power to the output end.

The test module 107 may be used to perform fault testing for the LCDI device. When all components of the LCDI device are working normally and there is no leakage current between the first leakage current detection line 141 and the first power supply line 11 or between the second leakage current detection line 142 and the second power supply line 12, if the test switch TEST is manually closed, the first output end A of the ZCT of the open circuit detection module 105 is above the threshold voltage, triggering the SCR via resistor R5. Thus, a current flows through the solenoid SOL, so the solenoid SOL drives the switch module 103 to disconnect power to the output end.

Figure 4:
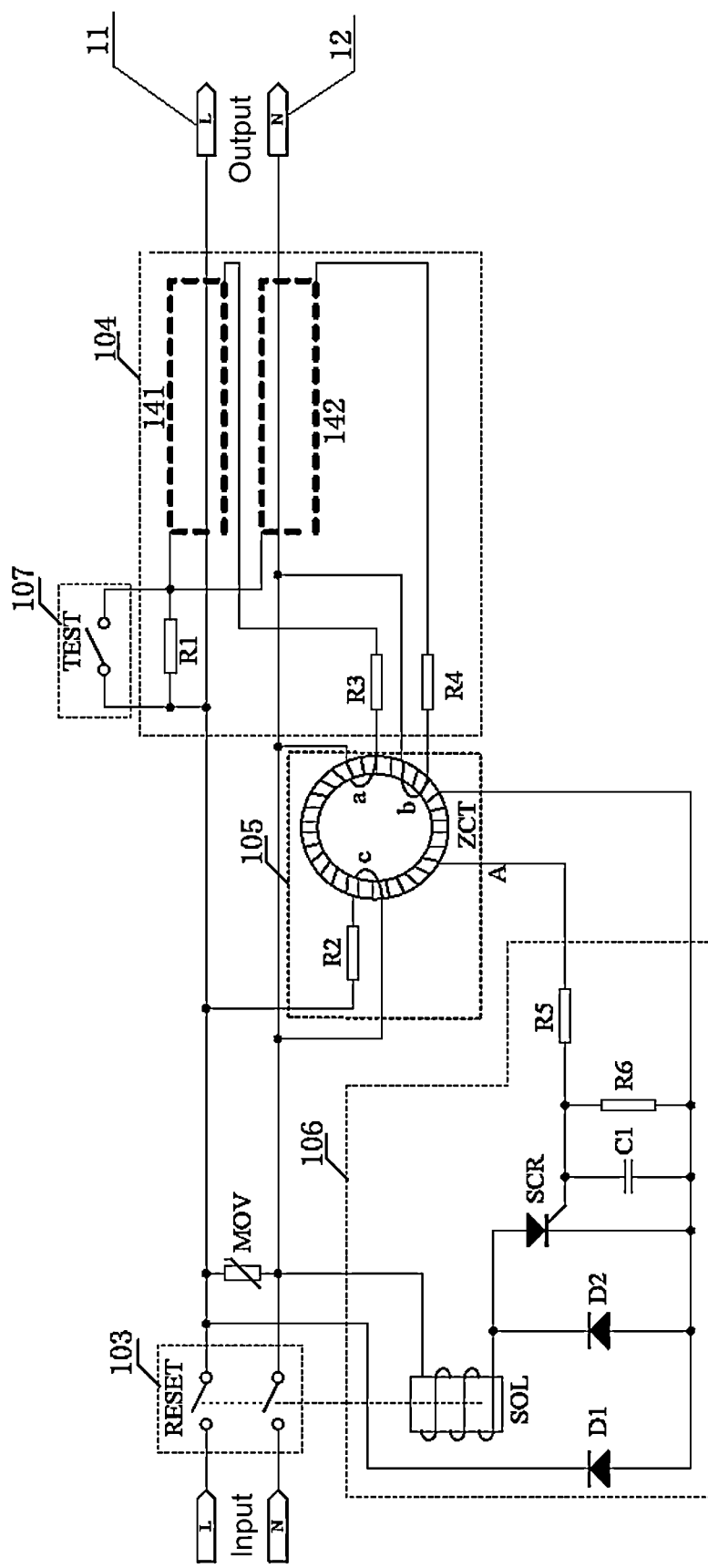
FIG. 4 is a circuit diagram of an LCDI device according to a third embodiment of the present invention.

FIG. 4 is a circuit diagram of an LCDI device according to a third embodiment of the present invention. Compared to the embodiments of FIG. 3, a main difference is that in FIG. 4, a current path formed by serial coupled first leakage current detection line 141, resistor R3 and a loop threading line a, and another current path formed by serial coupled second leakage current detection line 142, another loop threading line b, and resistor R3, are coupled in parallel with each other, and then coupled to resistor R1. A third loop threading line c and resistor R2 are coupled in series between first and second power supply lines 11 and 12. The operation of the leakage current detection module 104 for detecting leakage current on the first and second power supply lines 11 and 12, and the operation of the open circuit detection module 105 for detecting fault in the leakage current detection module 104, are similar to those in the embodiment of FIG. 3 and are not described in further detail.

Figure 5:
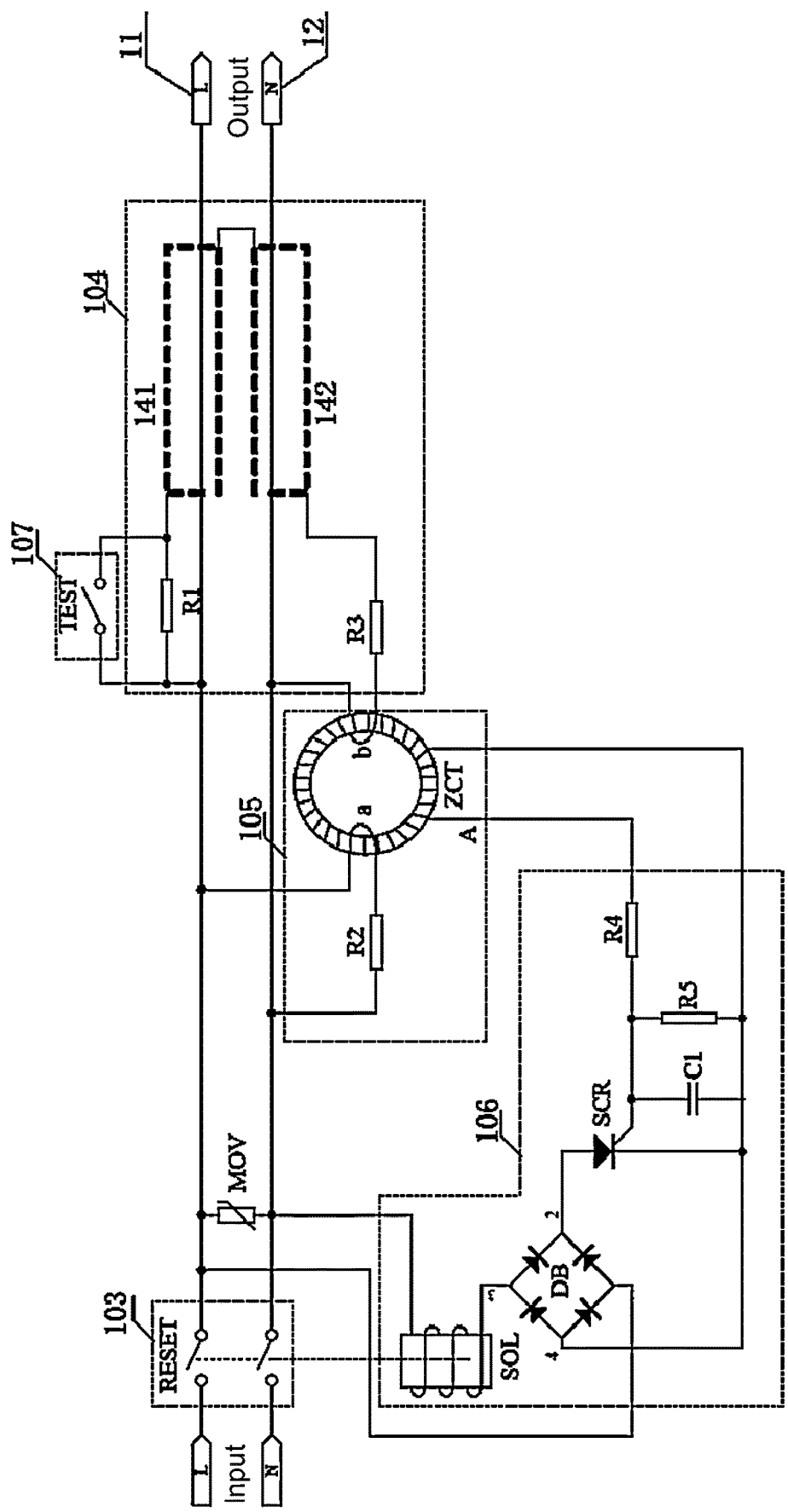
FIG. 5 is a circuit diagram of an LCDI device according to a fourth embodiment of the present invention.

FIG. 5 is a circuit diagram of an LCDI device according to a fourth embodiment of the present invention. Compared to the embodiment of FIG. 2, a main difference is that in FIG. 5, the trigger module 106 employs a full-bridge rectifier DB to replace the half-bridge rectifier in FIGS. 2-4. The operation of the leakage current detection module 104 for detecting leakage current on the first and second power supply lines 11 and 12, and the operation of the open circuit detection module 105 for detecting fault in the leakage current detection module 104, are similar to those in the embodiment of FIG. 2 and are not described in further detail.

Compared to the half-bridge rectifier in earlier embodiments, the full-bridge rectifier in this embodiment can reduce the required capacitance of the capacitor parallelly coupled to the SCR, and can more rapidly actuate the solenoid SOL when a leakage current or open circuit condition is detected, thereby enhancing the response speed and sensitivity of the LCDI device.

Figure 6:
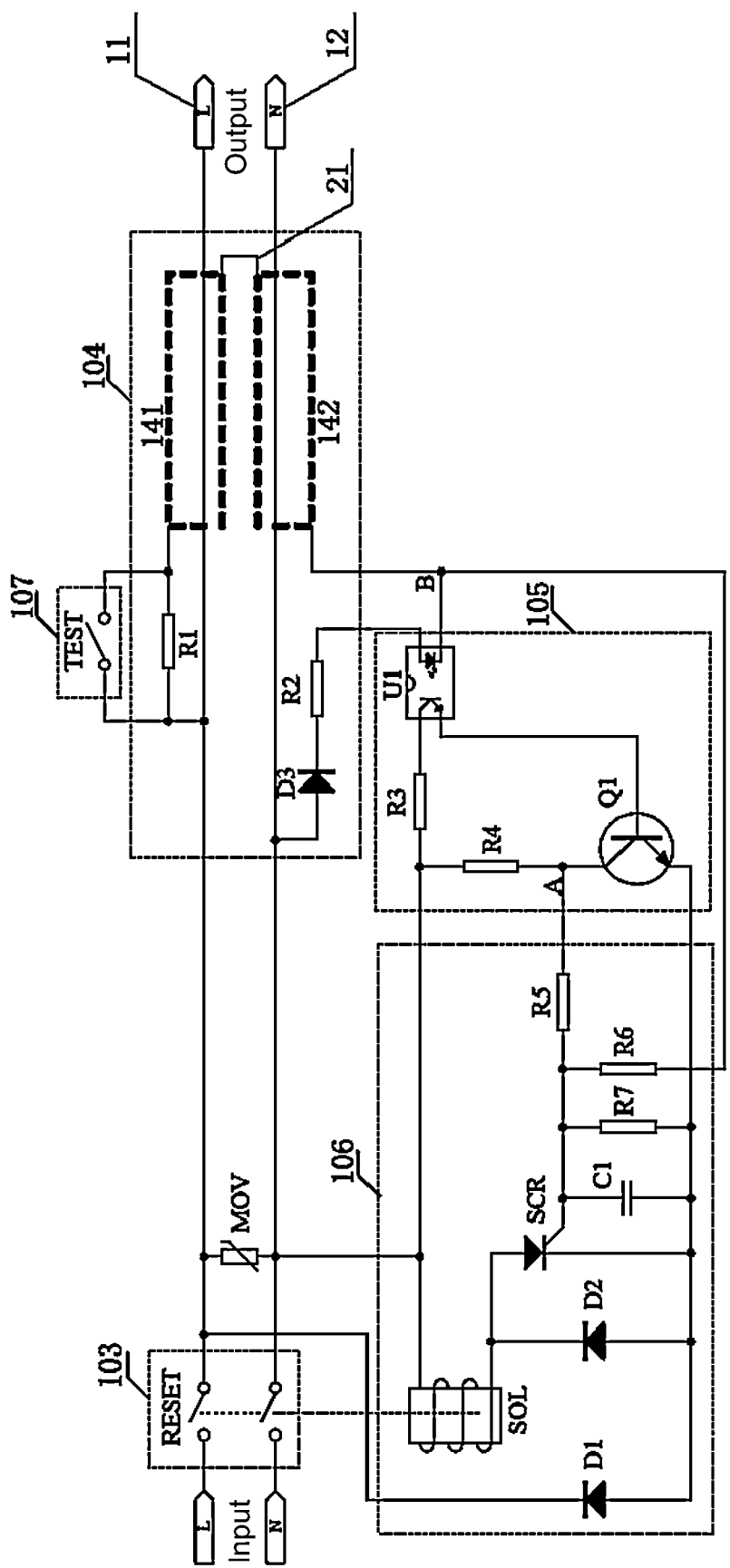
FIG. 6 is a circuit diagram of an LCDI device according to a fifth embodiment of the present invention.

FIG. 6 is a circuit diagram of an LCDI device according to a fifth embodiment of the present invention. As shown in FIG. 6, the LCDI device includes a switch module 103, a leakage current detection module 104, an open circuit detection module 105, a trigger module 106, and a test module 107.

In this embodiment, the open circuit detection module 105 includes at least a photocoupler U1 and a transistor Q1. More specifically, a first end B of the light emitting part of the photocoupler U1 is coupled to the first end of the second leakage current detection line 142, and also coupled via resistor R6 to the control electrode of the silicon trolled rectifier SCR; a second end of the light emitting part of the photocoupler U1 is coupled via resistor R2 and diode D3 to the second power supply line 12. A first end of the light receiving part of the photocoupler U1 is coupled to the base of transistor Q1, and its second end is coupled to one end of the solenoid SOL via resistor R3. The collector of transistor Q1 (point A) is coupled via resistor R5 to the control electrode of the silicon trolled rectifier SCR, and also coupled via resistor R4 to the one end of the solenoid SOL. The other components and their connections are similar to those in the embodiment of FIG. 2, and are not described in further detail.

When the LCDI device is working normally, a current flows from the second power supply line 12 to the first power supply line 11 via a current path formed by D3-R2-light emitting part of U1-142-141-R1. When the light receiving part of the photocoupler U1 is conductive, a current from the second power supply line 12 via resistor R3 and the photocoupler U1 drives transistor Q1 to become conductive. As a result, the output A (collector) of the transistor Q1 is at a low voltage, and cannot trigger the SCR via resistor R5. Meanwhile, by setting the ratio of the resistance of resistors R2 and R1, the first point B of the light emitting part of the photocoupler U1 is kept at a low voltage, and cannot trigger the SCR via resistor R6, so that the switch module 103 remains in the connected state.

When at least one of the first leakage current detection line 141 and second leakage current detection line 142 has an open circuit, no current flows through the light emitting part of the photocoupler U1, so the light receiving part of the photocoupler U1 is in the Off state. Thus, the transistor Q1 is not conductive, so the voltage at the output point A of the open circuit detection module 105 rises (which constitutes an open-circuit fault signal, an example of a trigger signal), which triggers the SCR via resistor R5. Thus, a current flows through the solenoid SOL, so the solenoid SOL drives the switch module 103 to disconnect power to the output end.

When the first power supply line 11 or second power supply line 12 has a leak, a leakage current is present on the first leakage current detection line 141 or the second leakage current detection line 142. As a result, the voltage at the first end B of the light emitting part of the photocoupler U1 is above the threshold voltage (which constitutes a leakage fault signal), which triggers the SCR via resistor R6. Thus, a current flows through the solenoid SOL, so the solenoid SOL drives the switch module 103 to disconnect power to the output end. In this embodiment, the leakage fault signal generated by the leakage current detection module 104 is directly fed to the trigger module 106 to trigger the SCR, without going through the open circuit detection module 105.

In this embodiment, the test module 107 may be operated to test the LCDI device. When all components of the LCDI are functioning normally and there is no leakage current between the first leakage current detection line 141 and first power supply line 11 or between the second leakage current detection line 142 and second power supply line 12, when the test switch TEST of the test module 107 is manually closed, the voltage at the first end B of the light emitting part of the photocoupler U1 is above the threshold voltage, which triggers the SCR via resistor R6. Thus, a current flows through the solenoid SOL, so the solenoid SOL drives the switch module 103 to disconnect power to the output end.

Figure 7:
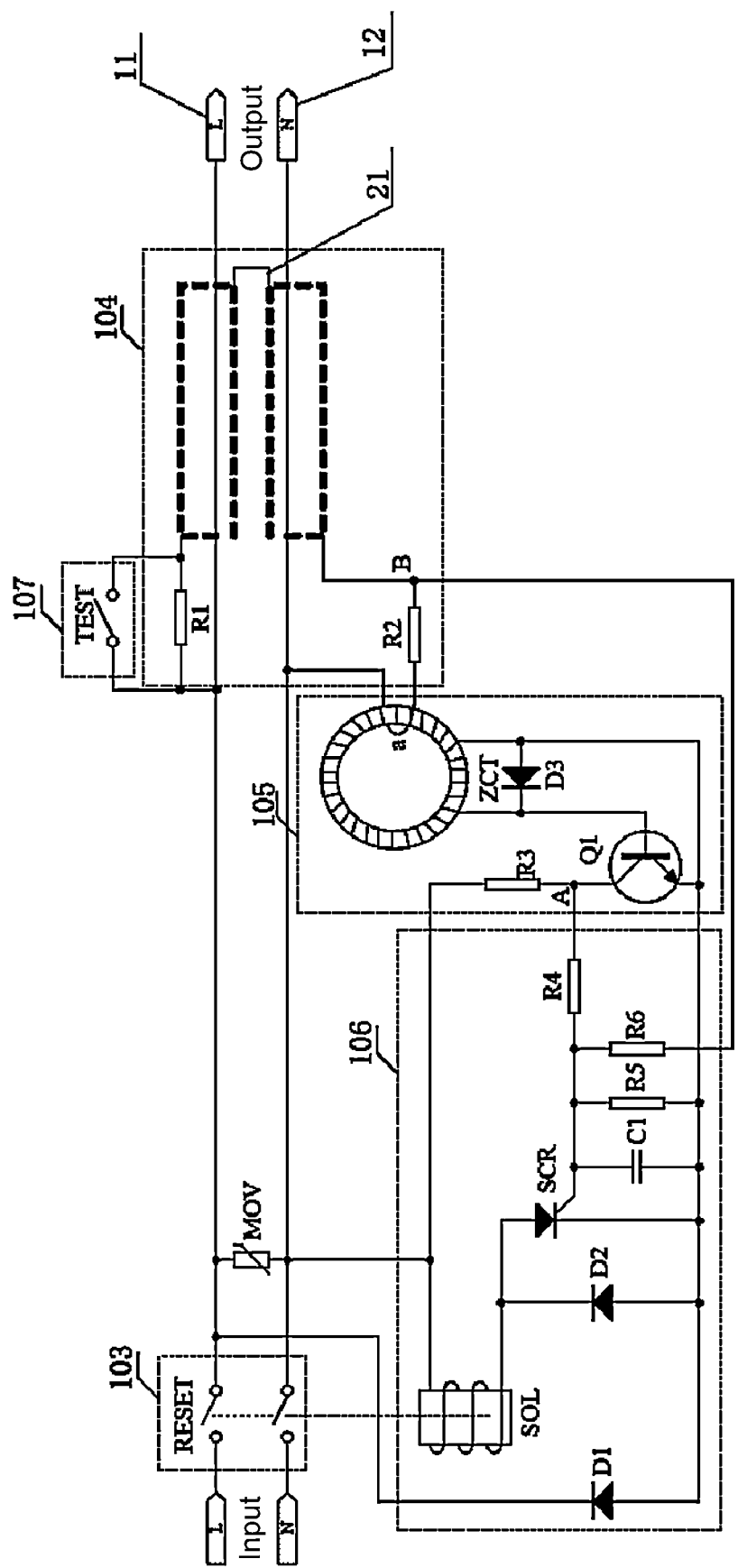
FIG. 7 is a circuit diagram of an LCDI device according to a sixth embodiment of the present invention.

FIG. 7 is a circuit diagram of an LCDI device according to a sixth embodiment of the present invention. Compared to the embodiment of FIG. 2, a main difference is that the open circuit detection module 105 in FIG. 7 includes: a zero-sequence current transformer ZCT, a transistor Q1, a diode D3, and a resistor R3. The ZCT has only one loop threading line a coupled to the second leakage current detection line 142, resistor R2 and second power supply line 12. The first end of the second leakage current detection line 142 is coupled via resistor R6 to the control electrode of the silicon trolled rectifier SCR. The two output ends of the ZCT are coupled across diode D3; one of the output ends is coupled to the base of transistor Q1, and the other one is coupled to the emitter of the transistor Q1, the anode of diode D2, and the anode of diode D1. The collector of transistor Q1 (point A) is coupled via resistor R4 to the control electrode of the SCR, and also coupled via resistor R3 to one end of the solenoid SOL and the second power supply line 12.

When the LCDI device is working normally, a current flows from the first power supply line 11 to the second power supply line 12 through a current path formed by R1-141-142-R2-a, so that the output of the ZCT drives the transistor Q1 to become conductive. As a result, the output end A of the open circuit detection module 105 is at a low voltage which cannot trigger the SCR via resistor R4. Meanwhile, the ratio of resistance of resistors R2 and R1 is set such that the voltage at the output end B of the second leakage current detection line 142 is at a low voltage which cannot trigger the SCR via resistor R6. As a result, the switch module 103 remains in a connected state.

When at least one of the second leakage current detection line 142 and first leakage current detection line 141 is an open circuit, no current flows through the ZCT on the loop threading line a, so that the ZCT does not output a signal. As a result, transistor Q1 does not become conductive, so the voltage at the output point A of the open circuit detection module 105 rises (which constitutes an open-circuit fault signal, an example of a trigger signal), which triggers the SCR via resistor R4. Thus, a current flows through the solenoid SOL, so the solenoid SOL drives the switch module 103 to disconnect power to the output end.

When the first power supply line 11 or second power supply line 12 has a leak, a leakage current is present on the first leakage current detection line 141 or second leakage current detection line 142. As a result, the voltage at the first end B of the second leakage current detection line 142 is above the threshold voltage (which constitutes the leakage fault signal), which triggers the SCR via resistor R6. Thus, a current flows through the solenoid SOL, so the solenoid SOL drives the switch module 103 to disconnect power to the output end. In this embodiment, the leakage fault signal generated by the leakage current detection module 104 is directly fed to the trigger module 106 to trigger the SCR, without going through the open circuit detection module 105.

In this embodiment, the test module 107 may be operated to test the LCDI device. When all components of the LCDI are functioning normally and there is no leakage current between the first leakage current detection line 141 and first power supply line 11 or between the second leakage current detection line 142 and second power supply line 12, when the test switch TEST of the test module 107 is manually closed, the voltage at the first end B of the second leakage current detection line 142 is above the threshold voltage, which triggers the SCR via resistor R6. Thus, a current flows through the solenoid SOL, so the solenoid SOL drives the switch module 103 to disconnect power to the output end.

In a second aspect, the present invention provides an electrical power connection device, which includes a body and an LCDI device according to any one of the above embodiments disposed inside the body.

In a third aspect, the present invention provides an electrical appliance, which includes an electrical load and an electrical power connection device coupled between a power supply and the load to supply power to the load, where the electrical power connection device employs an LCDI device according to any one of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

What is claimed is:

1. A leakage current detection and interruption device for a power cord, comprising:
    a first power supply line and a second power supply line;
    a switch module, configured to control an electrical connection of the first power supply line and second power supply line between an input end and an output end;
    a leakage current detection module, including a first leakage current detection line and a second leakage current detection line, which respectively cover the first and second power supply lines and are configured to respectively detect leakage currents on the first and second power supply lines;
    an open circuit detection module, including a zero-sequence current transformer coupled to the leakage current detection module, the open circuit detection module being configured to generate an open-circuit fault signal in response to detecting an open circuit condition in at least one of the first and second leakage current detection lines; and
    a trigger module, coupled to the switch module and an output of the open circuit detection module, configured to receive the open-circuit fault signal, and in response thereto, to drive the switch module to disconnect the electrical connection between the input and output ends.

2. The leakage current detection and interruption device of claim 1, wherein the trigger module includes:
    a solenoid, configured to generate an electromagnetic force in response to a current flowing therethrough to drive the switch module; and
    at least one semiconductor device, coupled in series with the solenoid, and coupled to the open circuit detection module, configured to cause a current to flow through the solenoid in response to the open-circuit fault signal.

3. The leakage current detection and interruption device of claim 2, wherein the trigger module further includes:
    a half-bridge rectifier, coupled to the solenoid, the semiconductor device and the open circuit detection module, configured to provide a rectified drive current to the solenoid; or
    a full-bridge rectifier, coupled to the solenoid, the semiconductor device and the open circuit detection module, configured to provide a rectified drive current to the solenoid.

4. The leakage current detection and interruption device of claim 2, wherein the semiconductor device is selected from a group consisting of: a silicon controlled rectifier, a bipolar transistor, a field-effect transistor, and a photocoupler.

5. The leakage current detection and interruption device of claim 1, wherein the zero-sequence current transformer is coupled to the first and second leakage current detection lines and the trigger module, wherein in response to the open circuit condition in at least one of the first and second leakage current detection lines, the zero-sequence current transformer generates the open-circuit fault signal and applies it to the trigger module.

6. The leakage current detection and interruption device of claim 1,
    wherein the leakage current detection module is configured to generate a leakage fault signal in response detecting the leakage current on the first and/or second power supply line,
    wherein the trigger module is further configured to receive the leakage fault signal from the leakage current detection module, and in response thereto, to drive the switch module to disconnect the electrical connection between the input and output ends.

7. The leakage current detection and interruption device of claim 1, wherein the leakage current detection module is configured to generate a leakage fault signal in response detecting the leakage current on the first and/or second power supply line, wherein the open circuit detection module is further configured to receive the leakage fault signal and to generate a trigger signal in response thereto, and wherein the trigger module is further configured to receive the trigger signal, and in response thereto, to drive the switch module to disconnect the electrical connection between the input and output ends.

8. The leakage current detection and interruption device of claim 1, further comprising a test module, which includes a test switch coupled to at least one of the first and second leakage current detection lines;

wherein in response to the test switch being closed and the leakage current detection module having no fault condition, the trigger module is further configured to drive the switch module to disconnect the electrical connection between the input and output ends.

9. An electrical power connection device, comprising:
a body; and
a leakage current detection and interruption device of claim 1, disposed inside the body.

10. An electrical appliance, comprising:
an electrical load; and
an electrical power connection device coupled between a power supply and the electrical load, configured to supply power to the electrical load, wherein the electrical power connection device includes a leakage current detection and interruption device of claim 1.

11. A leakage current detection and interruption device for a power cord, comprising:
a first power supply line and a second power supply line;
a switch module, configured to control an electrical connection of the first power supply line and second power supply line between an input end and an output end;
a leakage current detection module, including a first leakage current detection line and a second leakage current detection line, which respectively cover the first and second power supply lines and are configured to respectively detect leakage currents on the first and second power supply lines;
an open circuit detection module, including a photocoupler coupled to the leakage current detection module, the open circuit detection module being configured to generate an open-circuit fault signal in response to detecting an open circuit condition in at least one of the first and second leakage current detection lines, wherein the photocoupler is turned off in response to detecting the open circuit condition in the at least one of the first and second leakage current detection lines; and
a trigger module, coupled to the switch module and an output of the open circuit detection module, configured to receive the open-circuit fault signal, and in response thereto, to drive the switch module to disconnect the electrical connection between the input and output ends.

12. The leakage current detection and interruption device of claim 11, wherein the trigger module includes:
a solenoid, configured to generate an electromagnetic force in response to a current flowing therethrough to drive the switch module; and
at least one semiconductor device, coupled in series with the solenoid, and coupled to the open circuit detection module, configured to cause a current to flow through the solenoid in response to the open-circuit fault signal.

13. The leakage current detection and interruption device of claim 12, wherein the trigger module further includes:
a half-bridge rectifier, coupled to the solenoid, the semiconductor device and the open circuit detection module, configured to provide a rectified drive current to the solenoid; or
a full-bridge rectifier, coupled to the solenoid, the semiconductor device and the open circuit detection module, configured to provide a rectified drive current to the solenoid.

14. The leakage current detection and interruption device of claim 12, wherein the semiconductor device is selected from a group consisting of: a silicon controlled rectifier, a bipolar transistor, a field-effect transistor, and a photocoupler.

15. The leakage current detection and interruption device of claim 11, wherein the photocoupler is coupled to the first and second leakage current detection lines and the trigger module, wherein in response to the open circuit condition in at least one of the first and second leakage current detection lines, the photocoupler turns off to generate the open-circuit fault signal and applies it to the trigger module.

16. The leakage current detection and interruption device of claim 11,
wherein the leakage current detection module is configured to generate a leakage fault signal in response detecting the leakage current on the first and/or second power supply line,
wherein the open circuit detection module is further configured to receive the leakage fault signal and to generate a trigger signal in response thereto, and
wherein the trigger module is further configured to receive the trigger signal, and in response thereto, to drive the switch module to disconnect the electrical connection between the input and output ends.

17. The leakage current detection and interruption device of claim 11, further comprising a test module, which includes a test switch coupled to at least one of the first and second leakage current detection lines;
wherein in response to the test switch being closed and the leakage current detection module having no fault condition, the trigger module is further configured to drive the switch module to disconnect the electrical connection between the input and output ends.

18. An electrical power connection device, comprising:
a body; and
a leakage current detection and interruption device of claim 11, disposed inside the body.

19. An electrical appliance, comprising:
an electrical load; and
an electrical power connection device coupled between a power supply and the electrical load, configured to supply power to the electrical load, wherein the electrical power connection device includes a leakage current detection and interruption device of claim 11.

20. The leakage current detection and interruption device of claim 11,
wherein the leakage current detection module is configured to generate a leakage fault signal in response detecting the leakage current on the first and/or second power supply line,
wherein the trigger module is further configured to receive the leakage fault signal from the leakage current detection module, and in response thereto, to drive the switch module to disconnect the electrical connection between the input and output ends.

\* \* \* \* \*